(12) United States Patent
Kato

(10) Patent No.: US 10,984,516 B2
(45) Date of Patent: Apr. 20, 2021

(54) IMAGE INSPECTION DEVICE AND ILLUMINATION DEVICE

(71) Applicant: OMRON Corporation, Kyoto (JP)

(72) Inventor: Yutaka Kato, Kyotanabe (JP)

(73) Assignee: OMRON Corporation, Kyoto (JP)

( * ) Notice: Subject to any disclaimer, the term of this patent is extended or adjusted under 35 U.S.C. 154(b) by 145 days.

(21) Appl. No.: 16/162,412

(22) Filed: Oct. 17, 2018

(65) Prior Publication Data
US 2019/0220968 A1 Jul. 18, 2019

(30) Foreign Application Priority Data

Jan. 17, 2018 (JP) .............................. JP2018-005814

(51) Int. Cl.
*G06T 7/00* (2017.01)
*G06K 9/32* (2006.01)
(Continued)

(52) U.S. Cl.
CPC ....... *G06T 7/0002* (2013.01); *G01N 21/8806* (2013.01); *G01N 21/95684* (2013.01);
(Continued)

(58) Field of Classification Search
CPC ....... G01N 2021/8845; G01N 21/8806; G01N 21/95684; G03B 15/03; G03B 2215/0589;
(Continued)

(56) References Cited

U.S. PATENT DOCUMENTS

| 6,053,621 A * | 4/2000 | Yoneda ..................... F21K 9/00 356/237.2 |
| 2002/0093809 A1* | 7/2002 | Yoneda .............. G01N 21/8806 362/602 |

(Continued)

FOREIGN PATENT DOCUMENTS

| CN | 102608127 | 7/2012 |
| CN | 102721694 | 10/2012 |

(Continued)

OTHER PUBLICATIONS

"Search Report of Europe Counterpart Application", dated Jun. 4, 2019, p. 1-p. 7.

(Continued)

*Primary Examiner* — David Biloudeau
(74) *Attorney, Agent, or Firm* — JCIPRNET

(57) ABSTRACT

Provided are an image inspection device and an illumination device capable of thinning and downsizing the illumination device. An image inspection device includes a photographing part photographing an object, a light transmissive illumination part, and an optical member. The illumination part is arranged between the object and the photographing part and has a light emitting surface arranged to face the object. The optical member is arranged on the light emitting surface of the illumination part and transmits light emitted by the illumination part toward the object. The optical member includes a plurality of optical regions. The optical regions are arranged so as to surround a central region of the light emitting surface centered on an optical axis of the photo- (Continued)

graphing part, and are configured to emit light having mutually different color characteristics toward the object.

17 Claims, 14 Drawing Sheets

(51) Int. Cl.
    *G01N 21/88*     (2006.01)
    *G03B 15/03*     (2021.01)
    *H01L 27/146*     (2006.01)
    *G02B 27/09*     (2006.01)
    *G02B 5/20*     (2006.01)
    *H04N 5/247*     (2006.01)
    *H04N 5/225*     (2006.01)
    *G01N 21/956*     (2006.01)
    *F21V 8/00*     (2006.01)

(52) U.S. Cl.
    CPC ............ *G02B 5/20* (2013.01); *G02B 27/0977* (2013.01); *G03B 15/03* (2013.01); *G06K 9/3241* (2013.01); *H01L 27/14621* (2013.01); *H04N 5/2256* (2013.01); *H04N 5/247* (2013.01); *G01N 2021/8845* (2013.01); *G02B 6/0036* (2013.01); *G02B 6/0055* (2013.01); *G02B 6/0091* (2013.01); *G03B 2215/0582* (2013.01); *G03B 2215/0589* (2013.01)

(58) Field of Classification Search
    CPC ................ G06K 9/3241; G06T 7/0002; H01L 27/14621; H04N 5/2256
    See application file for complete search history.

(56) References Cited

U.S. PATENT DOCUMENTS

| | | | |
|---|---|---|---|
| 2006/0007531 A1* | 1/2006 | Korengut | G01N 21/9501 359/362 |
| 2007/0019186 A1* | 1/2007 | Sung | G01N 21/95684 356/237.5 |
| 2012/0249779 A1* | 10/2012 | Ji | G01N 21/8806 348/131 |
| 2017/0084504 A1* | 3/2017 | Park | H04N 5/2253 |
| 2018/0299386 A1* | 10/2018 | Masumura | G01N 21/95623 |

FOREIGN PATENT DOCUMENTS

| | | |
|---|---|---|
| CN | 103090202 | 5/2013 |
| CN | 107024172 | 8/2017 |
| JP | H061173 | 1/1994 |
| JP | 2002296198 | 10/2002 |
| JP | 5866586 | 2/2016 |
| TW | 200946814 | 11/2009 |
| WO | 2009087586 | 7/2009 |

OTHER PUBLICATIONS

"Office Action of China Counterpart Application", dated Jun. 22, 2020, with English translation thereof, p. 1-p. 19.

* cited by examiner

IMAGE INSPECTION DEVICE AND ILLUMINATION DEVICE

CROSS-REFERENCE TO RELATED APPLICATION

This application claims the priority benefit of Japan Application No. 2018-005814, filed on Jan. 17, 2018. The entirety of the above-mentioned patent application is hereby incorporated by reference herein and made a part of this specification.

BACKGROUND

Technical Field

The technology relates to an image inspection device and an illumination device inspecting a surface state of an object.

Related Art

In the field of factory automation (FA) and the like, there is known a technique of photographing while illuminating an object and inspecting a surface state of the object by using an obtained photographed image.

For example, Japanese Examined Patent Publication No. H6-1173 and Japanese Laid-open No. 2002-296198 disclose an image inspection device employing a color highlight system. In the image inspection device employing the color highlight system, an illumination device is used which is constituted by arranging a plurality of light sources emitting lights of mutually different colors so as to have mutually different irradiation angles with respect to a surface of an object. While the object is illuminated by the above illumination device, reflected light from the surface of the object is photographed by a photographing part, and a state of inclination of the surface of the object is detected using a photographed image.

In the above conventional image inspection device, in the illumination device, for example, by arranging a plurality of annular light sources such that their heights from a reference plane on which the object is placed are different from each other, the irradiation angles of a plurality of hue lights with respect to the surface of the object are made different from each other. Hence, a dimension of the illumination device in an optical axis direction of the photographing part may increase, and improvement thereof has been required.

In addition, a peephole of the photographing part is formed in a central part of the conventional illumination device, and the light sources are arranged so as to surround the peephole. The photographing part is arranged in a state in which the optical axis is aligned with the center of the peephole. Hence, there has been a problem that it is difficult to irradiate light in the optical axis direction of the photographing part in terms of structure, and a nearly flat plane in the surface of the workpiece cannot be detected. In regard to this problem, by further arranging coaxial episcopic illumination between the illumination device and the photographing part, the light in the optical axis direction can be irradiated; however, there is a concern that this may lead to a further increase in size of the illumination device.

The disclosure provides an image inspection device and an illumination device capable of thinning and downsizing the illumination device.

SUMMARY

According to an example of the disclosure, an image inspection device detecting a surface state of an object is provided. The image inspection device includes a photographing part photographing the object, a light transmissive illumination part, and an optical member. The illumination part is arranged between the object and the photographing part and has a light emitting surface arranged to face the object. The optical member is arranged on the light emitting surface of the illumination part and transmits light emitted by the illumination part toward the object. The optical member includes a plurality of optical regions. The optical regions are arranged so as to surround a central region of the light emitting surface centered on an optical axis of the photographing part, and are configured to emit light having mutually different color characteristics toward the object.

According to an example of the disclosure, an illumination device is provided, including the illumination part and the optical member provided in the above disclosure.

DESCRIPTION OF THE EMBODIMENTS

Figure 1:
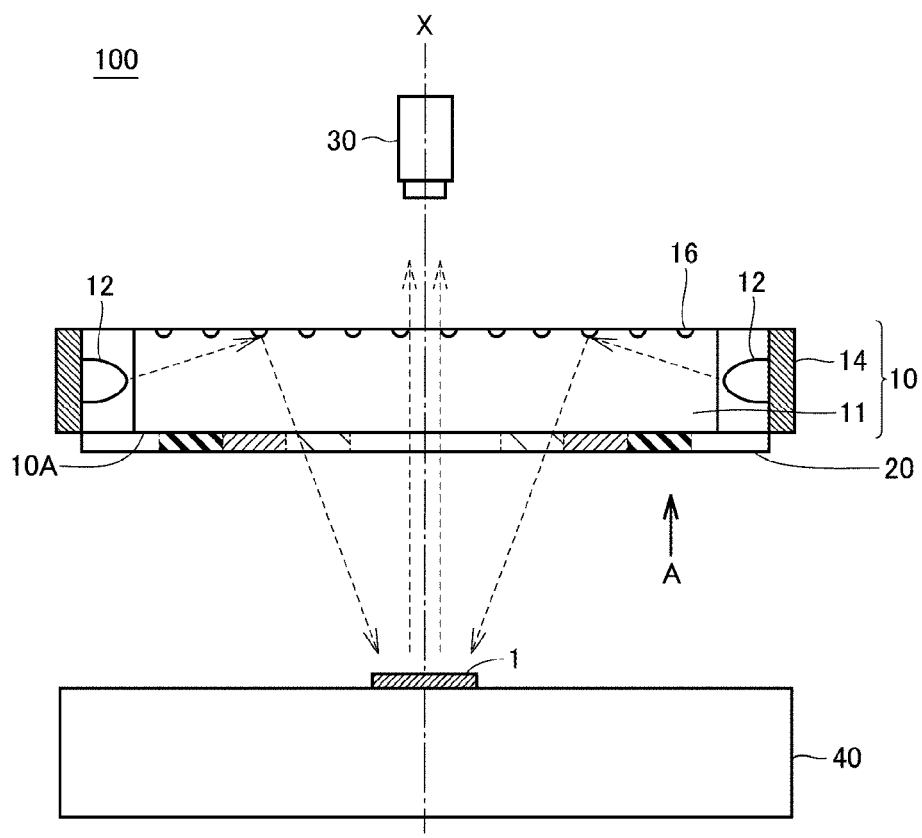
FIG. 1 is a schematic diagram showing a cross section of an illumination device included in an image inspection device according to the present embodiment.

According to an example of the disclosure, an image inspection device detecting a surface state of an object is provided. The image inspection device includes a photographing part photographing the object, a light transmissive illumination part, and an optical member. The illumination part is arranged between the object and the photographing part and has a light emitting surface arranged to face the object. The optical member is arranged on the light emitting surface of the illumination part and transmits light emitted by the illumination part toward the object. The optical member includes a plurality of optical regions. The optical regions are arranged so as to surround a central region of the light emitting surface centered on an optical axis of the photographing part, and are configured to emit light having mutually different color characteristics toward the object.

According to the disclosure, by arranging the optical member having the above configuration on the light emitting surface of the illumination part, light (illumination light) in the direction of the optical axis of the photographing part, and a plurality of hue lights, can be emitted from the optical member toward the object. In addition, the hue lights can be made different from each other in at least one of irradiation angle and irradiation direction with respect to the surface of the object. Unlike the conventional illumination device, since it is unnecessary to three-dimensionally arrange a plurality of light sources so that their heights from the reference plane are different from each other, the dimension of the illumination part in the optical axis direction can be shortened. Therefore, it is possible to constitute the illumination part by a thin flat illumination device. In addition, it is also unnecessary to provide the coaxial episcopic illumination for irradiating the object with the light in the optical axis direction. Therefore, the illumination device can be thinned and downsized.

In the above disclosure, the optical regions are concentrically arranged around the optical axis on the light emitting surface.

According to the disclosure, the hue lights can be irradiated from the optical member onto the surface of the object at mutually different irradiation angles. Therefore, what inclination angle the surface of the object has can be detected based on the photographed image.

In the above disclosure, the optical regions are arranged on the light emitting surface along a circumferential direction centered on the optical axis.

According to the disclosure, the hue lights can be irradiated from the optical member onto the surface of the object from mutually different directions. Therefore, which direction the surface of the object is inclined in can be detected based on the photographed image.

In the above disclosure, the optical regions are concentrically arranged in a matrix on the light emitting surface.

According to the disclosure, the hue lights can be irradiated from the optical member onto the surface of the object in a manner that at least one of irradiation angle and irradiation direction differs therebetween. Therefore, which direction the surface of the object is inclined in and what inclination angle the surface of the object has can be detected based on the photographed image.

In the above disclosure, the illumination part emits white light. The optical member includes a plurality of color filters arranged respectively in the optical regions and transmitting light of mutually different wavelengths.

According to the disclosure, since the optical member can be formed into a thin shape, it contributes to thinning and downsizing of the illumination device.

According to the above disclosure, the illumination part emits excitation light. The optical member includes a plurality of phosphors arranged respectively in the optical regions and converting the excitation light into light of mutually different wavelengths.

According to the disclosure, since the optical member can be formed into a thin film shape, it contributes to thinning and downsizing of the illumination device.

In the above disclosure, the optical member further includes a light shielding region arranged so as to surround the optical regions and shielding the illumination light.

According to the disclosure, it is possible to prevent the object from being irradiate with light other than the illumination light and the hue lights and to prevent reflected light thereof from entering the photographing part. Accordingly, since sharpness of the photographed image can be improved, accuracy of appearance inspection of the object can be improved.

In the above disclosure, the object is located within the central region in plan view of the optical member as seen from the side of the photographing part.

According to the disclosure, the central region is configured to transmit the illumination light in the optical axis direction. Hence, by locating the object within the central region in plan view of the optical member as seen from the side of the photographing part, the entire surface of the object can be irradiated with the illumination light in the optical axis direction. In addition, when the light reflected by the surface of the object is transmitted through the central region and the illumination part and reaches the photographing part, since the reflected light passes through the central region without passing through the optical regions, the color of the reflected light can be prevented from being changed.

In the above disclosure, the optical regions emit light having mutually different color characteristics within a photographing wavelength region of the photographing part toward the object.

According to the disclosure, as long as the hue light emitted from each optical region is included in the photographing wavelength region of the photographing part, the optical member can have a larger number of optical regions. Accordingly, by using a photographed color image, it becomes possible to inspect the surface state of the object in more detail.

In the above disclosure, the image inspection device further includes a light shielding member arranged on a surface of the illumination part opposite the light emitting surface and shielding light incident from outside the illumination part. The light shielding member has an opening part formed so that at least a portion of the opening part overlaps the central region in plan view as seen from the optical axis of the photographing part.

According to the disclosure, by the light shielding member, the light incident from the outside on the light transmissive illumination part can be prevented from being transmitted through the illumination part and being irradiated on the object. In addition, in the light shielding member, the opening part is formed so as not to prevent the reflected light from the object from reaching the photographing part. Accordingly, since sharpness of the photographed image can be improved, accuracy of appearance inspection of the object can be improved.

In the above disclosure, the light shielding member is configured to reflect the illumination light toward the light emitting surface.

According to the disclosure, since the light emitted by the light emitting part can be irradiated on the object without waste, luminous efficiency of the illumination part can be improved.

According to an example of the disclosure, an illumination device is provided, including the illumination part and the optical member provided in the above disclosure.

According to the disclosure, the illumination device used in an image inspection device can be thinned and downsized.

According to the disclosure, an image inspection device and an illumination device capable of thinning and downsizing the illumination device can be provided.

§ 1 Application Example

Figure 2:
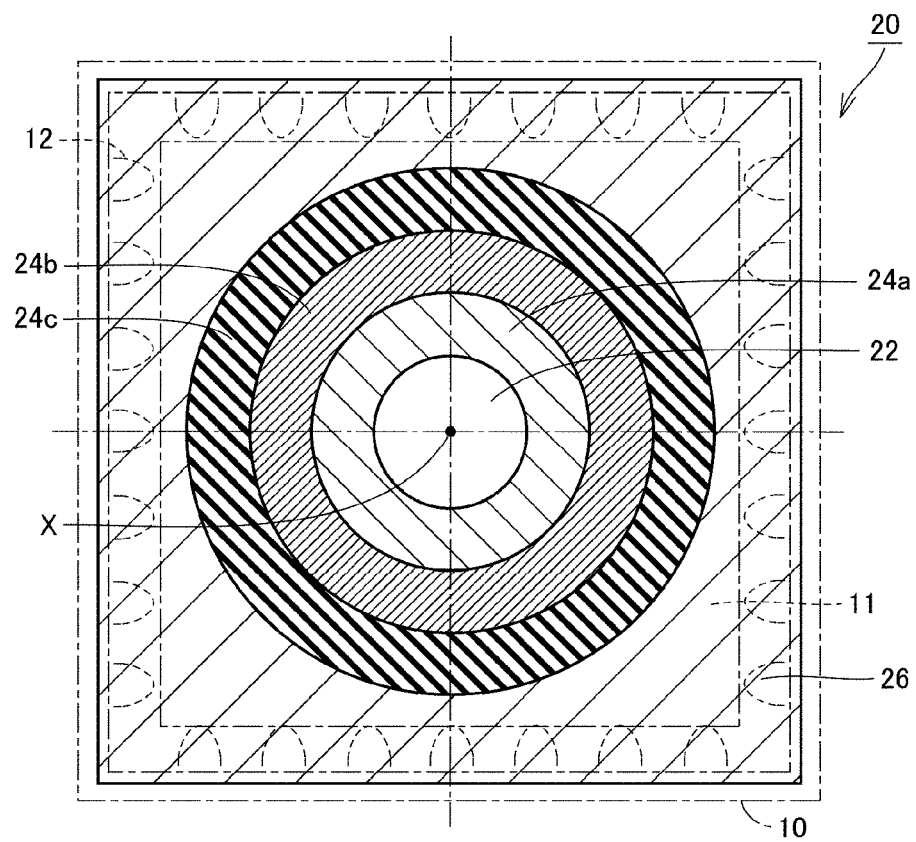
FIG. 2 schematically illustrates a configuration of an optical member shown in FIG. 1.

First of all, an example of a situation in which the disclosure is applied is explained using FIG. 1 and FIG. 2. FIG. 1 schematically illustrates an example of a situation of applying an image inspection device 100 according to the present embodiment.

The image inspection device 100 according to the present embodiment may be applied in a device for photographing while illuminating an object (hereinafter also called "workpiece 1") and performing appearance inspection (inspection for damage, dirt, foreign matter, etc.) on the object in a production line of an industrial product or the like. Since the image inspection device 100 inspects a surface state of the object by detecting light reflected by the object, one having specular reflectivity, such as a liquid crystal display or the like, is applied for the object.

Referring to FIG. 1, the image inspection device 100 according to the present embodiment is a device for inspecting the surface state of the workpiece 1 and includes an illumination part 10, an optical member 20, a photographing part 30, and a stage 40.

The photographing part 30 photographs the workpiece 1. Specifically, the photographing part 30 is arranged so that an optical axis X thereof matches a normal direction of the stage 40, and photographs the workpiece 1 on the stage 40 through the illumination part 10 and the optical member 20.

The illumination part 10 is arranged between the photographing part 30 and the workpiece 1, and illuminates the workpiece 1. The illumination part 10 is light transmissive. A light emitting surface 10A of the illumination part 10 is arranged to face the workpiece 1. In the present embodiment, the illumination part 10 outputs white light as illumination light.

The optical member 20 is arranged on the light emitting surface 10A of the illumination part 10. The optical member 20 is configured to transmit the illumination light (white light) emitted by the illumination part 10 toward the workpiece 1. With such a configuration, the workpiece 1 is irradiated with the illumination light transmitted through the optical member 20. As shown in FIG. 1, when the illumination light is reflected by a surface of the workpiece 1, the reflected light is transmitted through the optical member 20 and the illumination part 10 and is incident on the photographing part 30.

The illumination part 10 corresponds to an embodiment of "illumination part," and the optical member 20 corresponds to an embodiment of "optical member." The illumination part 10 and the optical member 20 constitute an embodiment of "illumination device."

FIG. 2 schematically illustrates a configuration of the optical member 20 shown in FIG. 1. FIG. 2 is a view as seen from a direction A in FIG. 1.

Referring to FIG. 2, the optical member 20 has a plurality of optical regions 24a to 24c and a light shielding region 26.

In the optical member 20, a central region 22 of the light emitting surface 10A centered on the optical axis X of the photographing part 30 is formed. In the example of FIG. 2, the central region 22 is a circular region. The central region 22 is a colorless transparent region, and is configured to transmit the light (white light) emitted by the illumination part 10 as it is without changing the color of the light. In the central region 22, a colorless filter transmitting white light may be provided. Instead of the colorless filter, a part of the optical member 20 corresponding to the central region 22 may be opened.

The central region 22 is formed so that the workpiece 1 is located within the central region 22 in plan view of the optical member 20 as seen from the side of the photographing part 30. According to this, a part of the illumination light emitted by the illumination part 10 is transmitted through the central region 22 and is irradiated on the entire surface of the workpiece 1. This part of the illumination light is roughly irradiated on the workpiece 1 in the direction of the optical axis X. In addition, the light reflected by the workpiece 1 is transmitted through the central region 22 and the illumination part 10 and reaches the photographing part 30. At this moment, since the reflected light passes through the central region 22 without passing through the optical regions 24a to 24c, the color of the reflected light is not changed by transmission through the optical member 20.

The optical regions 24a to 24c are arranged so as to surround the central region 22. In the example of FIG. 2, the optical regions 24a to 24c have an annular shape and are concentrically arranged so as to surround the central region 22. The optical regions 24a to 24c are configured to emit light having mutually different color characteristics toward the workpiece 1. The optical regions 24a to 24c can be composed of, for example, a plurality of color filters transmitting light of mutually different wavelengths. According to this, the light (white light) emitted from the light emitting surface 10A of the illumination part 10 is decomposed into a plurality of hue lights having mutually different color characteristics by being transmitted through the color filters.

The light shielding region 26 is arranged so as to surround the optical regions 24a to 24c and shields the illumination light. Accordingly, it is possible to prevent the workpiece 1 from being irradiate with light other than the illumination light and the hue lights emitted respectively from the optical regions 24a to 24c and to prevent reflected light thereof from entering the photographing part 30.

With such a configuration, the workpiece 1 is irradiated with the illumination light (white light) emitted from the central region 22 centered on the optical axis X of the photographing part 30 and light composed of the hue lights emitted from the optical regions 24a to 24c surrounding the central region 22. At this moment, the illumination light and the hue lights are irradiated on the surface of the workpiece 1 at mutually different angles.

By photographing the workpiece 1 under such illumination, a color image is generated in which, in the surface of the workpiece 1, a nearly flat plane (i.e., a plane nearly perpendicular to the optical axis X of the photographing part 30) has the color (white) of the illumination light, and an inclined plane has a hue of any one of the hue lights according to an inclination state of the inclined plane. Therefore, a state of inclination of the surface of the workpiece 1 can be detected by observing a hue pattern of a portion of the workpiece 1 in the photographed image.

In this way, according to the image inspection device 100 according to the present embodiment, the illumination light in the direction of the optical axis X of the photographing part 30 can be irradiated on the workpiece 1 from the illumination part 10 through the central region 22 of the optical member 20. Accordingly, the nearly flat plane in the surface of the workpiece 1 can be detected by using the photographed image.

In addition, according to the image inspection device 100 according to the present embodiment, by the optical regions 24a to 24c arranged on the light emitting surface 10A of the illumination part 10, the hue lights having mutually different color characteristics can be irradiated on the workpiece 1 at mutually different irradiation angles. Accordingly, the state of inclination of the surface of the workpiece 1 can be detected by using the photographed image.

Here, in a conventional image inspection device, an illumination device has been used in which a plurality of light sources respectively emitting a plurality of hue lights are arranged so as to have mutually different irradiation angles with respect to a surface of a workpiece. In this illumination device, by arranging the annular light sources so that their heights from a reference plane on which the workpiece is placed are different from each other, the irradiation angles of the hue lights with respect to the surface of the workpiece are made different from each other. Hence, a dimension of the illumination device in the optical axis direction of the photographing part may increase, and improvement thereof has been required.

In addition, a peephole of the photographing part is formed in a central part of the above conventional illumination device, the light sources are arranged so as to surround the peephole, and the photographing part is arranged in a state in which the optical axis is aligned with the center of the peephole. Hence, there has been a problem that it is difficult to irradiate light in the optical axis direction of the photographing part in terms of structure, and a nearly flat plane in the surface of the object cannot be detected. In regard to this problem, by further arranging coaxial episcopic illumination between the illumination device and the photographing part, the light in the optical axis direction can be irradiated. However, there is a concern that this may lead to a further increase in size of the illumination device.

In the image inspection device 100 according to the present embodiment, by arranging the optical member 20 having the above configuration on the light emitting surface 10A of the illumination part 10 that emits monochromatic light, it is possible to substantially irradiate the workpiece 1 with the light (illumination light) in the direction of the optical axis X and the hue lights having mutually different irradiation angles with respect to the surface of the workpiece 1.

According to this, since it is unnecessary to three-dimensionally arrange the light sources so that their heights from the reference plane are different from each other, a dimension of the illumination part 10 in the optical axis direction can be shortened. Therefore, it is possible to constitute the illumination part 10 by a thin flat illumination device. In addition, it is also unnecessary to arrange the coaxial episcopic illumination for irradiating the light in the optical axis direction of the photographing part. Therefore, the illumination device can be thinned and downsized.

§ 2 Configuration Example

Hereinafter, an example of the image inspection device 100 according to the present embodiment is explained in detail with reference to the drawings. Moreover, the same or equivalent parts in the drawings are denoted by the same reference numerals, and explanations thereof are not repeated.

<A. Application Example of Image Inspection Device>

Figure 3:
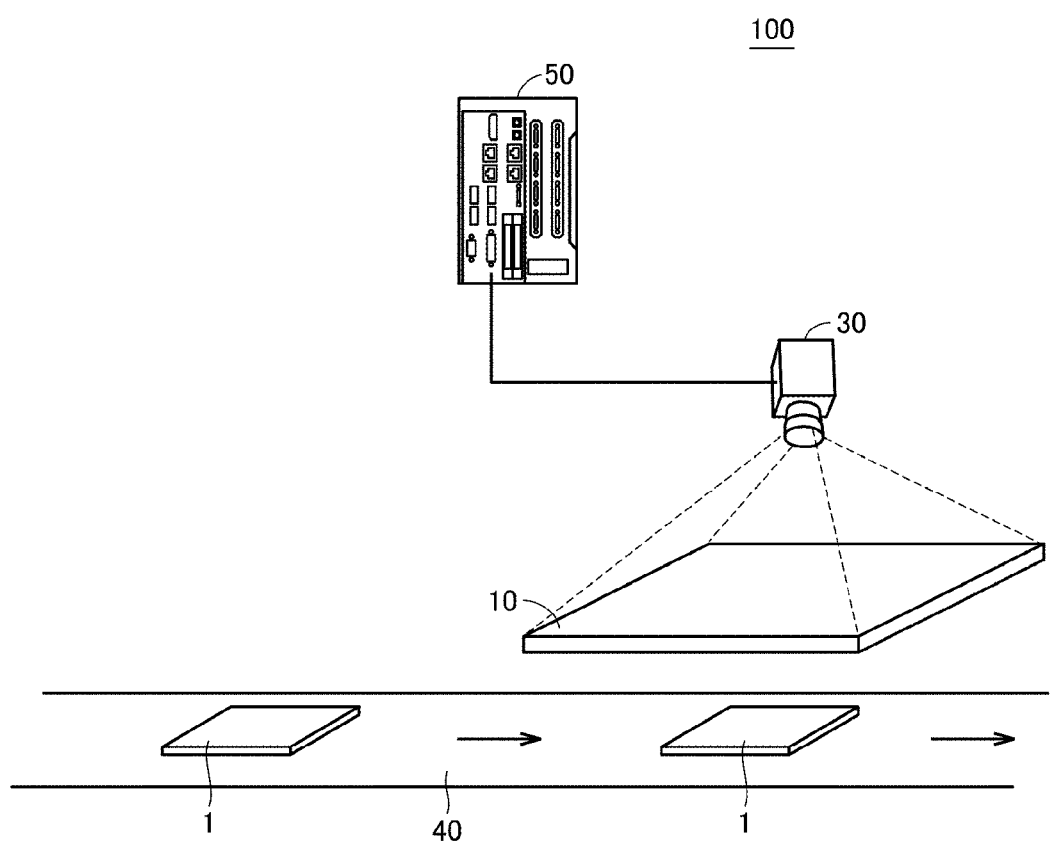
FIG. 3 is a schematic diagram showing an example of a production line to which the image inspection device according to the present embodiment is applied.

FIG. 3 is a schematic diagram showing an example of a production line to which the image inspection device 100 according to the present embodiment is applied.

Referring to FIG. 3, the image inspection device 100 includes the photographing part 30 photographing the workpiece 1 to be continuously carried in, the illumination part 10 illuminating the workpiece 1, and a control device 50 controlling the illumination part 10 and the photographing part 30. In a production line of an industrial product or the like, the image inspection device 100 is a device that photographs the workpiece 1 with the photographing part 30 while illuminating the workpiece 1 with the illumination part 10 under control of the control device 50 and performs appearance inspection of the workpiece 1 by using an obtained photographed image.

Specifically, the workpiece 1 is moved by the movable stage 40 to an inspection position where the photographing part 30 and the illumination part 10 are fixed. When the workpiece 1 is moved to the inspection position, the workpiece 1 stops there until the appearance inspection performed by the image inspection device 100 ends. At this moment, the control device 50 photographs the workpiece 1 with the photographing part 30 while illuminating the workpiece 1 with the illumination part 10. The image inspection device 100 uses the photographed image to inspect the surface state of the workpiece 1.

<B. Overall Configuration Example of Image Inspection Device>

Figure 4:
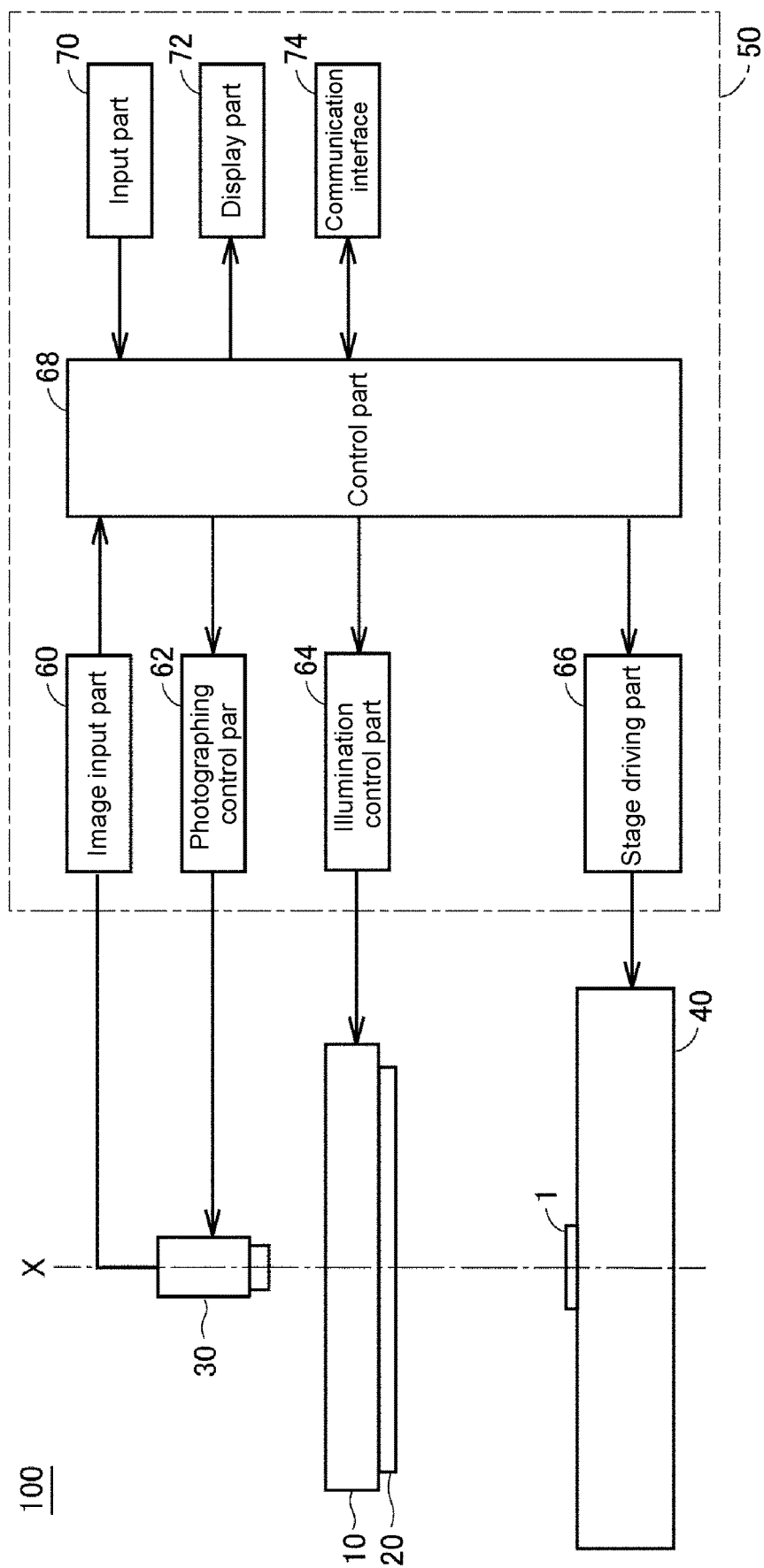
FIG. 4 is a block diagram showing an overall configuration of the image inspection device according to the present embodiment.

FIG. 4 is a block diagram showing an overall configuration of the image inspection device 100 according to the present embodiment.

Referring to FIG. 4, the image inspection device 100 includes the illumination part 10, the optical member 20, the photographing part 30, the stage 40, and the control device 50 controlling the illumination part 10, the photographing part 30 and the stage 40. The control device 50 typically has a structure in accordance with a generic computer architecture, and realizes various processing by executing preinstalled programs by a processor.

<C. Configuration Example of Illumination Part>

Referring back to FIG. 1, the illumination part 10 includes a light guide plate 11 arranged between the workpiece 1 and the photographing part 30, a plurality of light emitting parts 12 arranged around the light guide plate 11, and a plurality of reflectors 16 inside the light guide plate 11. In FIG. 1, for convenience of explanation, in the light guide plate 11, the side of a surface located on the side of the photographing part 30 is defined as "upper surface side," and the side of a surface located on the side of the workpiece 1 is defined as "bottom surface side."

The light guide plate 11 introduces therein light of the light emitting parts 12 arranged therearound, and by moving while diffusing the introduced light inside and emitting the light to the outside, guides the light of the light emitting parts 12 to the workpiece 1. That is, the bottom surface side of the light guide plate 11 constitutes the light emitting surface 10A of the illumination part 10.

For the light emitting parts 12, light emitting diodes (LEDs) or fluorescent lamps using cathode ray tubes or the like may be applied. In addition, emission colors of the light emitting parts 12 are not limited to white, and may be red, green, blue, and the like.

The shape of the light guide plate 11 may be polygonal, such as quadrangular or triangular or the like, or circular or elliptical or the like, as seen from the upper surface side or the bottom surface side. In the present embodiment, quadrangular shape is taken as an example of the shape of the light guide plate 11 as seen from the upper surface side or the bottom surface side. For the light guide plate 11, a member made of such as acrylic or the like having excellent light guiding properties may be applied.

The reflectors 16 are inside the light guide plate 11. Each of the reflectors 16 has a shape and a position designed so that the reflector 16 reflects the light from the light emitting part 12 to thereby guide the light in a direction (the direction of the bottom surface side) in which the workpiece 1 is located. The reflector 16 may have a rectangular or triangular shape, or may be platelike, as long as it guides the light from the light emitting part 12 in the direction in which the workpiece 1 is located by reflecting the light. The reflector 16 may be formed by cutting out a part of the light guide plate 11 by laser processing or the like.

The light guide plate 11 is arranged between the workpiece 1 and the photographing part 30. Hence, the workpiece 1 and the light from the illumination part 10 can be placed on the optical axis X of the photographing part 30. With such a configuration, the light emitted from the light guide plate 11 is reflected by the workpiece 1, and the reflected light can again pass through the inside of the light guide plate 11 and reach the photographing part 30.

<D. Configuration Example of Optical Member>

The optical member 20 transmits the light emitted by the illumination part 10 toward the workpiece 1, and is configured to emit a plurality of hue lights having mutually different color characteristics toward the workpiece 1. In the present embodiment, the optical member 20 is configured to emit a first to third hue lights toward the workpiece 1.

Specifically, referring to FIG. 2, the optical member 20 has a similar shape to that of the light guide plate 11. That is, the shape of the optical member 20 is quadrangular as seen from the upper surface side or the bottom surface side. As shown in FIG. 1, the optical member 20 is arranged on a bottom surface (equivalent to the light emitting surface 10A) of the light guide plate 11.

The optical member 20 has the first optical region 24a, the second optical region 24b, the third optical region 24c, and the light shielding region 26.

In the optical member 20, the circular central region 22 centered on the optical axis X of the photographing part 30 is formed. The central region 22 is colorless and transparent, and transmits the light (white light) emitted from the light guide plate 11 without changing the color of the light. The central region 22 can be composed of an opening part formed so as to penetrate the optical member 20 in the direction of the optical axis X. Alternatively, the central region 22 can be composed of a circular colorless filter.

The first to third optical regions 24a to 24c have an annular shape and are concentrically arranged so as to surround the circular central region 22. The first to third optical regions 24a to 24c are for changing the color of the illumination light (white light) emitted by the illumination part 10. The first to third optical regions 24a to 24c are configured to change the illumination light (white light) emitted by the illumination part 10 into hue lights having mutually different color characteristics.

Specifically, the first optical region 24a changes the illumination light (white light) into a first hue light. The second optical region 24b changes the illumination light (white light) into a second hue light. The third optical region 24c changes the illumination light (white light) into a third hue light. All of the first to third hue lights are included within a photographing wavelength region of the photographing part 30. For example, the first hue light is blue light, the second hue light is green light, and the third hue light is red light. As long as the hue light emitted from each optical region is included in the photographing wavelength region of the photographing part 30, the optical member 20 can have a larger number of optical regions.

The light shielding region 26 is concentrically arranged so as to surround the optical regions 24a to 24c and shields the illumination light. Accordingly, it is possible to prevent the workpiece 1 from being irradiate with light other than white light and the first to third hue lights and to prevent reflected light thereof from entering the photographing part 30.

With the above configuration, the workpiece 1 is irradiated with circular white light centered on the optical axis X of the photographing part 30 and light composed of the concentrically arranged annular first to third hue lights.

At this moment, the white light and the first to third hue lights are irradiated on the surface of the workpiece 1 at mutually different angles. Specifically, the white light is irradiated from the direction of the optical axis X. The first hue light (blue light) is irradiated at a smallest angle with respect to the optical axis X. The third hue light (red light) is irradiated at a largest angle with respect to the optical axis X. The second hue light (green light) is irradiated at an angle intermediate between the first and third hue lights.

By photographing the workpiece 1 under such illumination, a color image is generated in which, in the surface of the workpiece 1, a nearly flat element (i.e., the surface nearly perpendicular to the optical axis X) becomes white, a gently inclined element has the first hue (blue), a sharply inclined element has the third hue (red), and an element in an inclined state intermediate the above two elements has the second hue (green). Therefore, the state of inclination of the surface of the workpiece 1 can be detected by observing a hue pattern of a portion of the workpiece 1 in the photographed image.

In the optical member 20, each of the first optical region 24a, the second optical region 24b, and the third optical region 24c can be formed using, for example, a color filter such as a color film or the like. The color filter is a filter that transmits only light of a specific wavelength.

In the first to third optical regions 24a to 24c, color films of the first to third hues that transmit mutually different wavelengths are respectively arranged. The color film of the first hue transmits the first hue light (blue light), the color film of the second hue transmits the second hue light (green light), and the color film of the third hue transmits the third hue light (red light).

More specifically, by attaching the color film of the first hue, the color film of the second hue and the color film of the third hue to the light emitting surface 10A of the illumination part 10 concentrically with respect to the optical axis X, the first to third optical regions 24a to 24c can be formed. In addition, the central region 22 can be formed on an inner circumferential side of the color film of the first hue. A colorless film may be attached to the central region 22. The illumination light transmitted through the color films of the first to third hues is colored in the first to third hues.

Alternatively, the light emitting part 12 in the illumination part 10 may be composed of a light emitting element emitting excitation light, and each of the first to third optical regions 24a to 24c may be formed of a phosphor. For example, an ultraviolet LED emitting ultraviolet light (excitation light) can be used for the light emitting part 12. The first optical region 24a is formed of a first phosphor layer absorbing the ultraviolet light and emitting fluorescence of the first hue. The second optical region 24b is formed of a second phosphor layer absorbing the ultraviolet light and emitting fluorescence of the second hue. The third optical region 24c is formed of a third phosphor layer absorbing the ultraviolet light and emitting fluorescence of the third hue. The first to third phosphor layers can be formed, for example, by applying particles of each phosphor to a corresponding region of the light emitting surface 10A of the illumination part 10.

<E. Configuration Example of Photographing Part>

The photographing part 30 is, for example, a camera. The camera includes, as main components, an optical system such as a lens and a diaphragm or the like, and a light receiving element such as a charge coupled device (CCD) image sensor or a complementary metal-oxide-semiconductor (CMOS) image sensor or the like.

<F. Configuration Example of Control Device>

Referring back to FIG. 4, the control device 50 includes an image input part 60, a photographing control part 62, an illumination control part 64, a stage driving part 66, a control part 68, an input part 70, a display part 72, and a communication interface (I/F) 74.

The image input part 60 includes an interface circuit receiving an image signal outputted from the photographing part 30, and an analog-to-digital (A/D) conversion circuit converting the image signal to digital format, and the like. The photographing control part 62 controls photographing timing of the photographing part 30. The illumination control part 64 controls light quantity and lighting timing and the like of the light emitting parts 12 of the illumination part 10.

The stage driving part 66 drives the stage 40 to move the workpiece 1 to the inspection position where the photographing part 30 and the illumination part 10 are fixed. The input part 70 is for performing a setting operation such as teaching or the like, and is composed of a dedicated operation button, a mouse, a keyboard or the like. The display part 72 is for displaying an image for inspection and an inspection result and the like, and is composed of a liquid crystal panel or the like. The communication interface 74 is used for sending the inspection result to an external device.

The control part 68 includes a processor such as a central processing unit (CPU) or a microprocessing unit (MPU) or the like, and a memory such as a random access memory (RAM) and a read only memory (ROM) or the like. In the memory, in addition to programs relating to control and inspection, an inspection data file in which various setting data used for inspection are entered is stored. The inspection data file contains a movement amount of the stage 40 required for putting the workpiece 1 within a field of view of the photographing part 30, and a determination criterion for determining suitability of a feature value obtained by inspecting the appearance of the workpiece 1, and the like.

The control part 68 uses these programs and setting data to determine a positional relationship between the photographing part 30 and the workpiece 1, causes the photographing part 30 to perform photographing, and captures a photographed image via the image input part 60. The image data inputted from the image input part 60 express colors by combining white and gradation data of each of the first to third hues. The control part 68 uses the inputted image to execute the appearance inspection of the workpiece 1, and determines whether the workpiece 1 is a good product or a defective product based on the inspection result. In addition to being displayed on the display part 72, the inspection result is outputted to an external machine (not illustrated) via the communication interface 74.

<G. Principle of Appearance Inspection in Image Inspection Device>

Next, a principle of the appearance inspection in the image inspection device 100 according to the present embodiment is explained.

Figure 5:
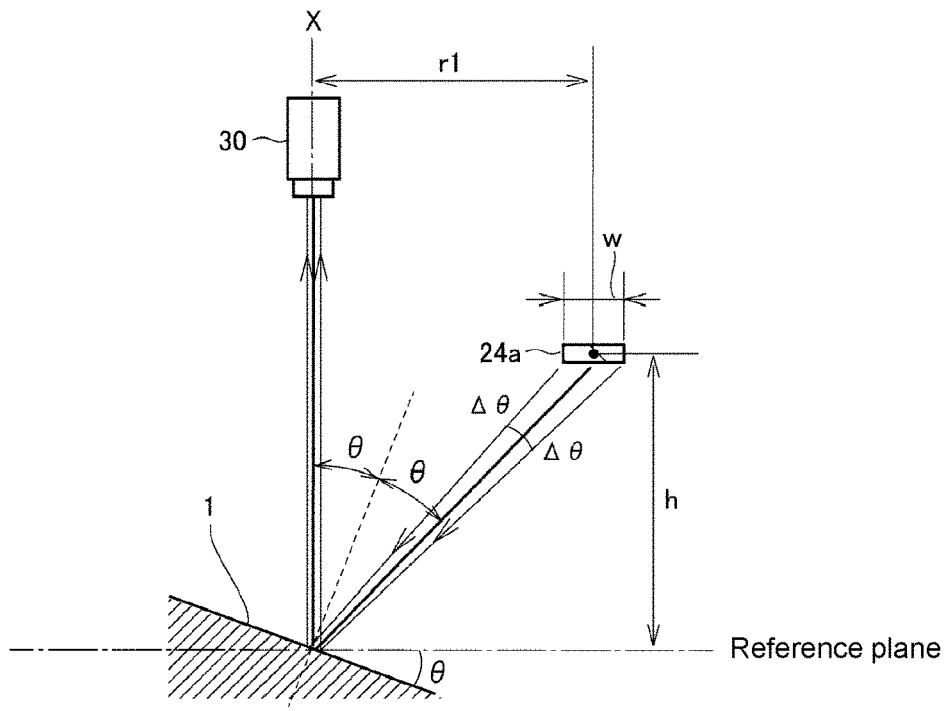
FIG. 5 is a diagram for explaining a principle of appearance inspection in the image inspection device according to the present embodiment.

FIG. 5 schematically illustrates a positional relationship between one optical region (e.g., the first optical region 24a) included in the optical member 20 and the surface of the workpiece 1.

As shown in FIG. 5, in the case where the first hue light is irradiated from the first optical region 24a onto an element (hereinafter also referred to as surface element) of the surface of the workpiece 1 at an incidence angle θ (equivalent to an angle formed with a normal of the surface element), reflected light with a reflection angle equal to the incidence angle θ is incident on the photographing part 30 placed directly above and is detected. Accordingly, it is known that the surface element is inclined at an angle of θ with respect to a reference plane.

In FIG. 5, when a radius of the first optical region 24a is set to r1 and a height from the reference plane to the first optical region 24a is set to h, the inclination angle θ of the surface element of the workpiece 1 can be approximated as in the following equation.

$$\cos 2\theta = h/(r1^2 + h^2)^{1/2} \quad (1)$$

Moreover, the incidence angle of the first hue light is in a range from θ+Δθ to θ−Δθ according to a width w of the first optical region 24a in a radial direction. Hence, the reflected light having a range corresponding to the range of the incidence angle is detected by the photographing part 30. Therefore, the surface element having an inclination angle ranging from θ+Δθ to θ−Δθ with respect to the reference plane can be detected.

In addition, as shown in FIG. 2, since the first optical region 24a has an annular shape, no matter what rotation angle the workpiece 1 has with respect to a normal of the reference plane, a distance between the first optical region 24a and the workpiece 1 is fixed. Therefore, since orientation of the surface element of the workpiece 1 in a rotation angle direction is eliminated, only the inclination angle with respect to the reference plane is detected.

Figure 6:
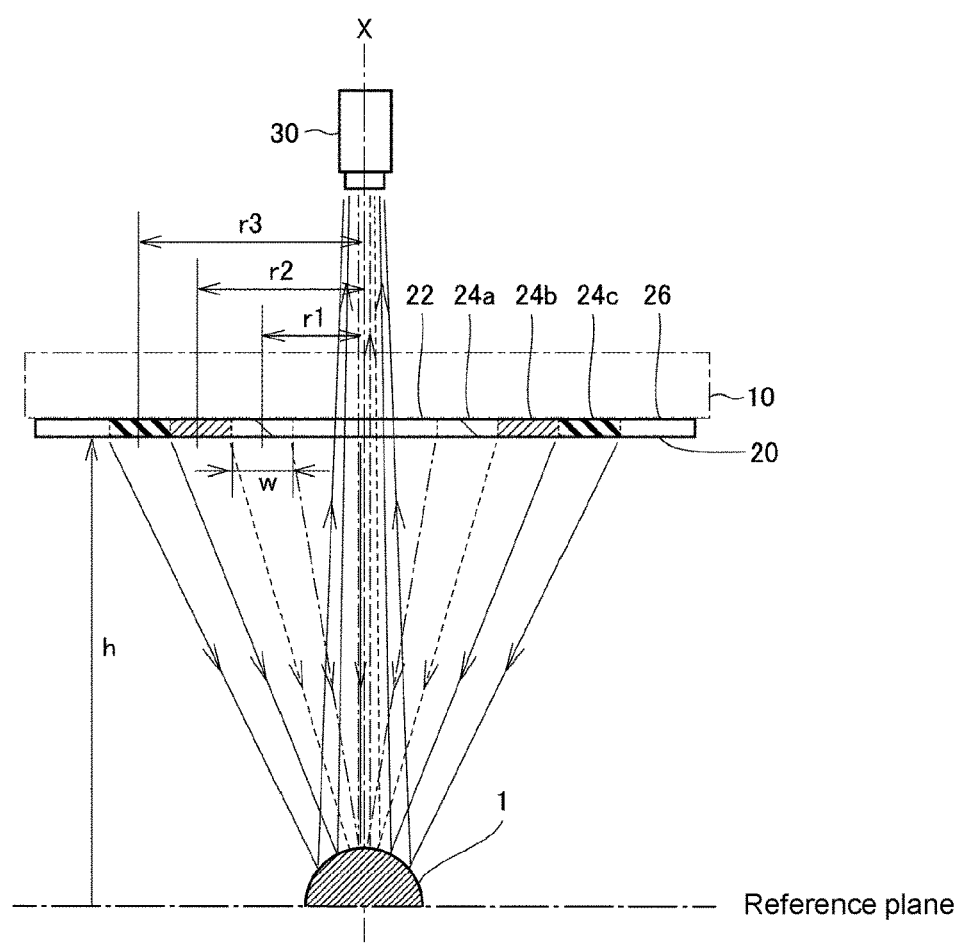
FIG. 6 is a diagram for explaining the principle of appearance inspection in the image inspection device according to the present embodiment.

Furthermore, as shown in FIG. 6, by constituting the optical member 20 by the concentrically arranged first to third optical regions 24a to 24c, the first to third hue lights are irradiated on each surface element of the workpiece 1 at mutually different incidence angles. Therefore, in the photographing part 30, a group of surface elements corresponding to the respective incidence angles are detected by the photographing part 30.

Moreover, in the second optical region 24b and the third optical region 24c, similarly to the first optical region 24a shown in FIG. 5, the range of the inclination angle of the surface element that can be detected is determined according to the radius r and the width w in the radial direction and the height h from the stage 40, of each of the second optical region 24b and the third optical region 24c. In the first to third optical regions 24a to 24c, since at least the radii (equivalent to r1, r2 and r3 in the drawing) are different from each other, the range of the inclination angle that can be detected also differs. Accordingly, by using the photographed color image, what inclination angle each surface element of the workpiece 1 has, i.e., what shape the surface of the workpiece 1 has, can be detected.

In FIG. 6, from the central region 22 formed centered on the optical axis X, the illumination light (white light) emitted by the illumination part 10 is irradiated in the direction of the optical axis X, i.e., the normal direction of the stage 40. Since the illumination light is irradiated on the surface of the workpiece 1 at an incidence angle θ of approximately 90°, as the reflected light of the illumination light is incident on the photographing part 30 and is detected, it can be detected that the corresponding element is a plane that forms approximately 90° with respect to the stage 40, i.e., a nearly flat plane.

By providing a plurality of optical regions in the optical member 20 in this manner, a surface element having an orientation corresponding to the incidence angle of light from each optical region can be detected. Therefore, by further increasing the number of optical regions, it becomes possible to inspect the surface state of the workpiece 1 in more detail. However, in order to detect a plurality of hue lights corresponding to the optical regions in the photographing part 30, it is necessary that the light emitted from each of the optical regions be included in the photographing wavelength region of the photographing part 30.

<H. Modifications>

Hereinafter, modifications of the image inspection device 100 according to the present embodiment are explained.

(Modification 1)

In the present embodiment, since the illumination part 10 is light transmissive, the photographing part 30 can photograph the workpiece 1 through the illumination part 10. However, there is a possibility that light of other illumination device (e.g., an interior light in the factory, etc.) incident on the upper surface side of the light guide plate 11 may also be transmitted through the illumination part 10 and irradiated on the workpiece 1. Accordingly, there is a concern that inspection accuracy of the surface state of the workpiece 1 may deteriorate.

In Modification 1, a configuration of an illumination device capable of suppressing entry of the light from other illumination device is explained.

Figure 7:
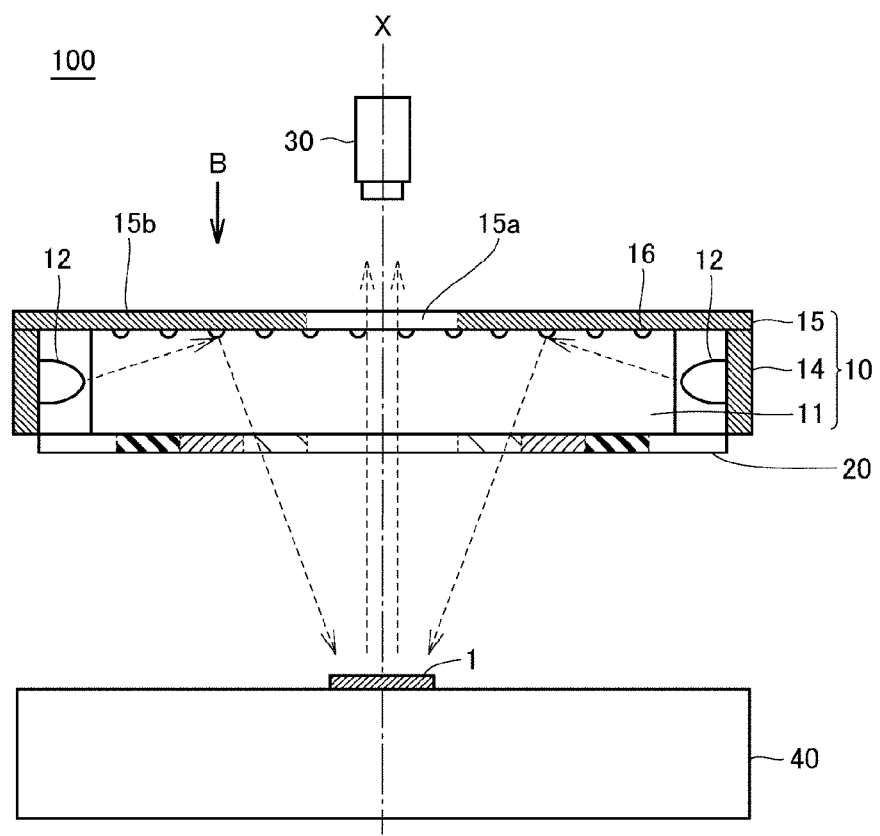
FIG. 7 is a schematic diagram showing a cross section of the illumination device included in the image inspection device according to a modification of the present embodiment.

FIG. 7 is a schematic diagram showing a cross section of an illumination device included in the image inspection device 100 according to Modification 1.

Referring to FIG. 7, the image inspection device 100 according to the present modification differs from the image inspection device 100 shown in FIG. 1 in that a light shielding member 15 is further included.

The light shielding member 15 is arranged on a surface (upper surface) in the illumination part 10 opposite the light emitting surface 10A. In the example of FIG. 7, the light shielding member 15 is arranged on the upper surface of the light guide plate 11.

Figure 8:
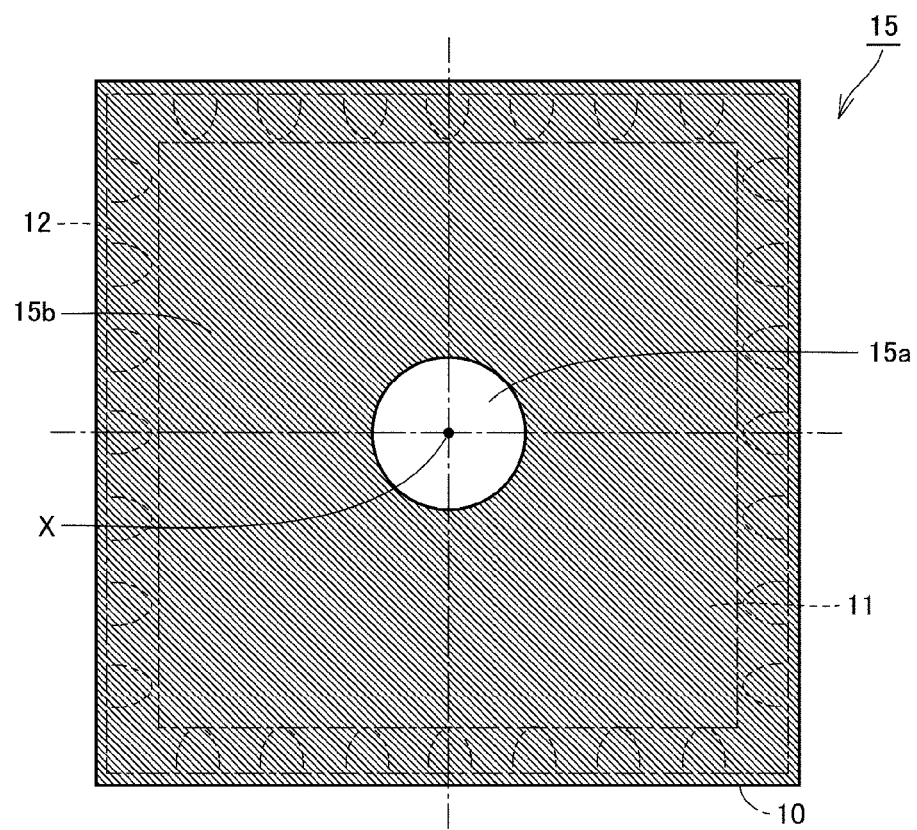
FIG. 8 schematically illustrates a configuration of a light shielding member shown in FIG. 7.

FIG. 8 schematically illustrates a configuration of the light shielding member 15 shown in FIG. 7. FIG. 8 is a view as seen from a direction B in FIG. 7.

Referring to FIG. 8, the light shielding member 15 has a similar shape to that of the light guide plate 11. That is, the shape of the light shielding member 15 is quadrangular as seen from the upper surface side. The light shielding member 15 has, for example, a plate shape, and covers the upper surface of the light guide plate 11 to thereby be capable of blocking the light of the other illumination device from being incident on the upper surface side of the light guide plate 11. Accordingly, the workpiece 1 can be prevented from being irradiated with the light of other illumination device.

However, in the light shielding member 15, an opening part 15a having a circular shape centered on the optical axis X is formed. At least a portion of the opening part 15a overlaps the central region 22 in plan view as seen from the optical axis X. In this way, the light reflected by the workpiece 1 can reach the photographing part 30 without being blocked by the light shielding member 15. The shape of the opening part 15a is not limited to a circular shape, and may be a quadrangular shape.

In the present modification, the light shielding member 15 may be composed of a reflective member. The reflective member is configured to reflect the light emitted by the light emitting part 12 toward the direction (the direction of the bottom surface side) in which the workpiece 1 is located. According to this, since the light emitted by the light emitting part 12 can be irradiated on the workpiece 1 without waste, luminous efficiency of the illumination part 10 can be improved.

(Modification 2)

In Modifications 2 to 7, modifications of the optical member 20 are explained. Moreover, the configuration of the image inspection device according to Modifications 2 to 7 is the same as the image inspection device 100 shown in FIG. 1, except for the configuration of the optical member 20.

Figure 9:
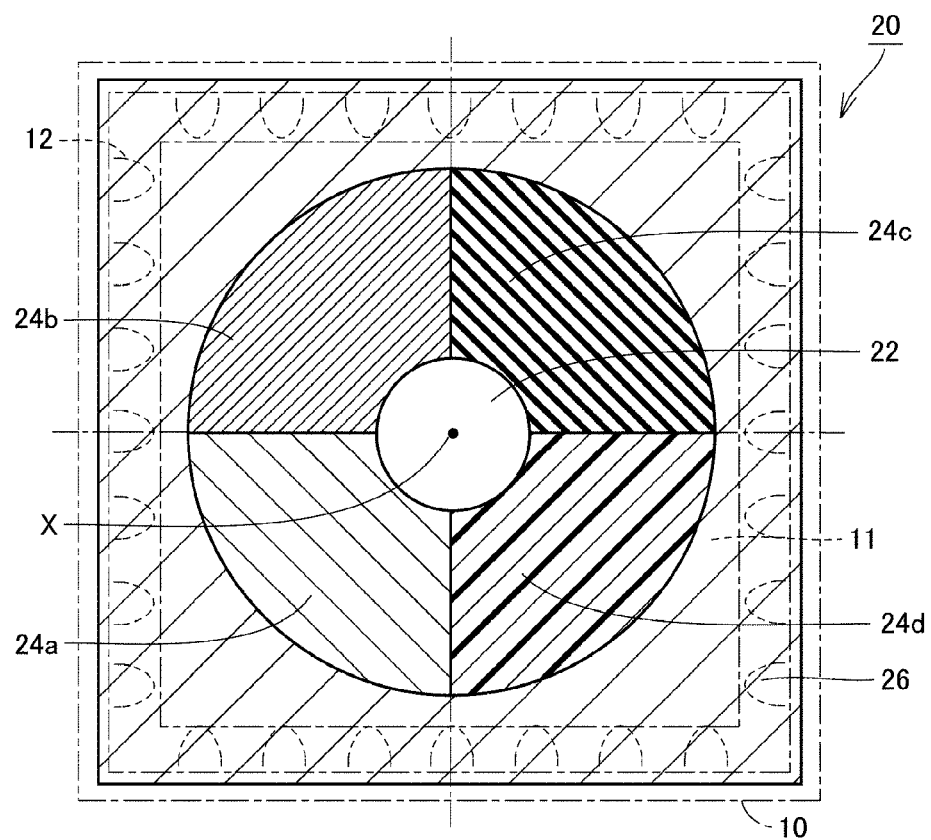
FIG. 9 schematically illustrates a configuration of a modification of the optical member shown in FIG. 1.

FIG. 9 schematically illustrates a configuration of a modification of the optical member 20 shown in FIG. 1. FIG. 9 is a view as seen from the direction A in FIG. 1.

Referring to FIG. 9, the optical member 20 according to the present modification has the first to fourth optical regions 24a to 24d and the light shielding region 26. In the optical member 20, the central region 22 centered on the optical axis X of the photographing part 30 is formed. In the example of FIG. 9, the central region 22 is a circular region, as in FIG. 2.

The first to fourth optical regions 24a to 24d are arranged so as to surround the central region 22. In the example of FIG. 9, the first to fourth optical regions 24a to 24d have a quarter circular arc shape centered on the optical axis X, and are arranged along a circumferential direction centered on the optical axis X. That is, the optical member 20 according to the present modification differs from the optical member 20 shown in FIG. 2 in number of optical regions, shape of optical regions, and arrangement of optical regions.

Here, assuming that the light emitting surface 10A of the illumination part 10 is a two-dimensional polar coordinate plane centered on the optical axis X, the first to fourth optical regions 24a to 24d are regions having the same range of radius direction (distance from the optical axis X) but mutually different ranges of deflection angle (angle from a half line passing through the optical axis X). On the other hand, the first to third optical regions 24a to 24c shown in FIG. 2 are regions having the same range of deflection angle but mutually different ranges of radius direction on the polar coordinate plane.

The first to fourth optical regions 24a to 24d change the illumination light (white light) emitted by the illumination part 10 into hue lights having mutually different color characteristics. Specifically, the first optical region 24a changes the illumination light into the first hue light (blue light). The second optical region 24b changes the illumination light into the second hue light (green light). The third optical region 24c changes the illumination light into the third hue light (red light). The fourth optical region 24d changes the illumination light into a fourth hue light (yellow light).

The light shielding region 26 is arranged so as to surround the first to fourth optical regions 24a to 24d and shields the illumination light.

With such a configuration, the workpiece 1 is irradiated with the illumination light (white light) emitted from the central region 22 and light composed of the first to fourth hue lights emitted respectively from the first to fourth optical regions 24a to 24d surrounding the central region 22.

Figure 10:
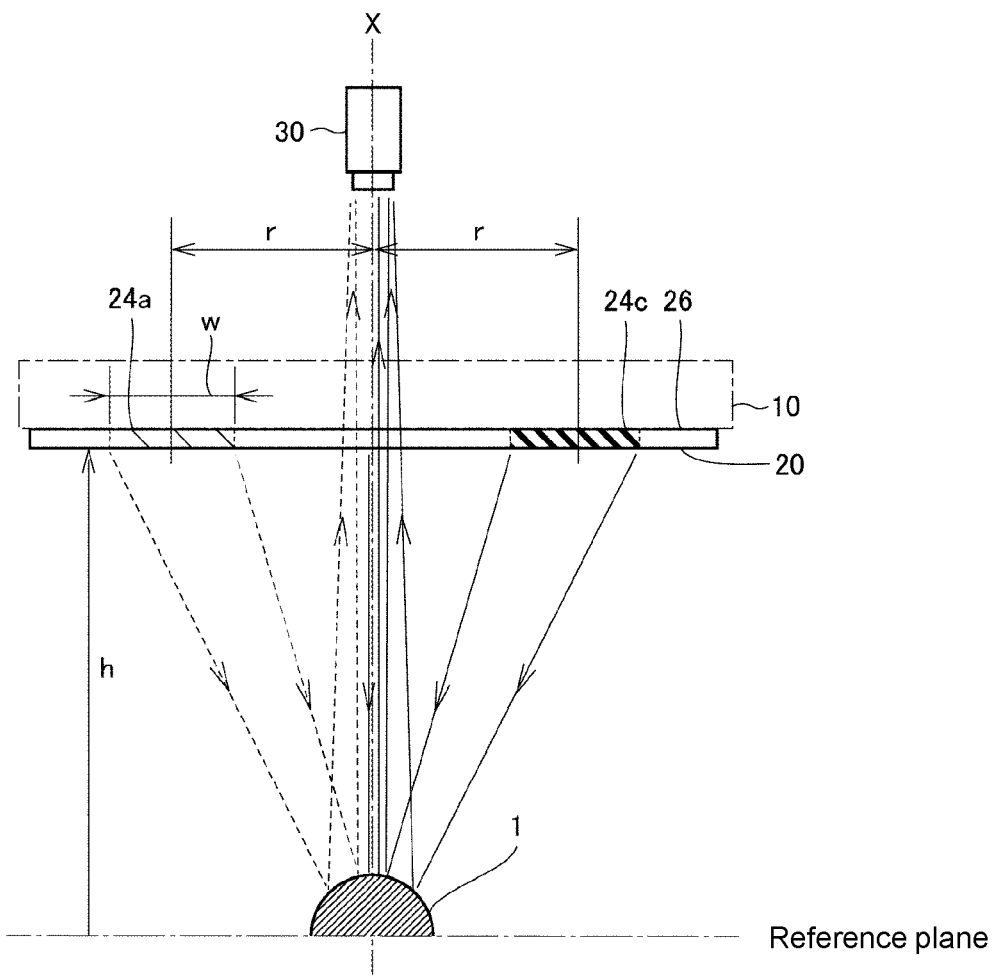
FIG. 10 schematically illustrates a positional relationship between two optical regions included in the optical member and workpiece surface.

FIG. 10 schematically illustrates a positional relationship between two optical regions (e.g., the first optical region 24a and the third optical region 24c) included in the optical member 20 and the surface of the workpiece 1.

In the present modification, the illumination light and the first to fourth hue lights are emitted toward the surface of the workpiece 1 from mutually different directions. Specifically, the white light is emitted from the direction of the optical axis X. The second hue light is emitted from a direction deviating approximately 90° with respect to the first hue light along the circumferential direction centered on the optical axis X. The third hue light is emitted from a direction deviating approximately 90° with respect to the second hue light along the circumferential direction centered on the optical axis X. The fourth hue light is emitted from a direction deviating approximately 90° with respect to the third hue light along the circumferential direction centered on the optical axis X. The first hue light is emitted from a direction deviating approximately 90° with respect to the fourth hue light along the circumferential direction centered on the optical axis X. FIG. 10 shows how the first hue light and the third hue light are irradiated from the directions line-symmetrical with respect to the optical axis 1. In FIG. 10, the first hue light and the third hue light are irradiated on the surface of the workpiece 1 at substantially the same irradiation angle but in different irradiation directions.

By photographing the workpiece 1 under such illumination, a color image is generated in which, in the surface of the workpiece 1, a nearly flat element (i.e., an element nearly perpendicular to the optical axis X) becomes white, an element that is inclined so that the normal approaches an emission direction of the first hue light has the first hue (blue), an element that is inclined so that the normal approaches an emission direction of the second hue light has the second hue (green), an element that is inclined so that the normal approaches an emission direction of the third hue light has the third hue (red), and an element that is inclined so that the normal line approaches an emission direction of the fourth hue light has the fourth hue (yellow). Therefore, the state of inclination of the surface of the workpiece 1 can be detected by observing a hue pattern of a portion of the workpiece 1 in the photographed image.

In the case of using the optical member 20 shown in FIG. 2, since the first to third hue lights are irradiated on the surface of the workpiece 1 at mutually different angles, what inclination angle each surface element of the workpiece 1 has can be detected based on the color image; however, on the other hand, it is difficult to detect in which direction each surface element is inclined. This is because, as described above, in the optical member 20 of FIG. 2, since the first to third optical regions 24a to 24c have an annular shape and have the same range of deflection angle on the polar coordinate plane, if a plurality of surface elements are equal to each other in inclination angle, whichever direction each surface element is inclined, the surface elements have the same hue in the color image. Therefore, it can be said that the optical member 20 of FIG. 2 is suitable for detecting the inclination angle of the surface of the workpiece 1.

In contrast, in the case of using the optical member 20 shown in FIG. 9, since the first to fourth optical regions 24a to 24d have different ranges of deflection angle on the polar coordinate plane, if a plurality of surface elements have mutually different inclination directions, since the surface elements have different hues on the color image, which direction each surface element is inclined in can be detected. On the other hand, in the optical member 20 of FIG. 9, since each of the first to fourth optical regions 24a to 24d has the same hue on the polar coordinate plane even if the radius direction changes, if a plurality of surface elements have identical inclination directions to each other, even if the inclination angles differ, the surface elements have the same hue in the color image. Hence, it is difficult to detect what inclination angle each surface element has based on the color image. Therefore, it can be said that the optical member 20 of FIG. 9 is suitable for detecting the inclination direction of the surface of the workpiece (Modification 3)

Figure 11:
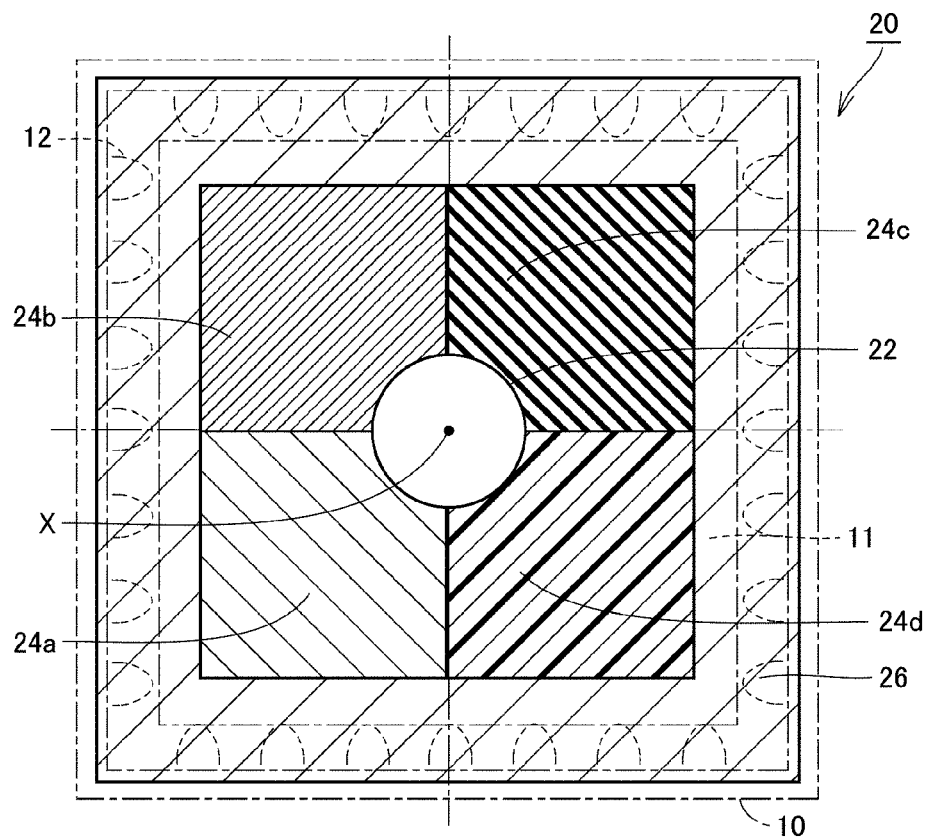
FIG. 11 schematically illustrates a configuration of a modification of the optical member shown in FIG. 1.

FIG. 11 schematically illustrates a configuration of a modification of the optical member 20 shown in FIG. 1. FIG. 11 is a view as seen from the direction A in FIG. 1.

Referring to FIG. 11, the optical member 20 according to the present modification has the first to fourth optical regions 24a to 24d and the light shielding region 26. In the optical member 20, the central region 22 centered on the optical axis X of the photographing part 30 is formed. In the example of FIG. 11, the central region 22 is a circular region, as in FIG. 2.

The first to fourth optical regions 24a to 24d are arranged so as to surround the central region 22. The first to fourth optical regions 24a to 24d change the illumination light (white light) emitted by the illumination part 10 into hue lights having mutually different color characteristics. In the example of FIG. 11, the first to fourth optical regions 24a to 24d have a nearly quadrangular shape, and are arranged along the circumferential direction centered on the optical axis X. That is, the optical member 20 according to the present modification and the optical member 20 shown in FIG. 9 are identical in number and arrangement of optical regions, but different in shape of optical regions.

Therefore, in the present modification, as in the above-mentioned Modification 2, the illumination light and the first to fourth hue lights are emitted toward the surface of the workpiece 1 from mutually different directions. By photographing the workpiece 1 under such illumination, which direction each surface element of the workpiece 1 is inclined in can be detected based on the photographed color image.

Moreover, in the optical member 20 according to the above-mentioned Modification 2 and the present modification, the shape of the optical regions can be various according to the number of the optical regions arranged in the circumferential direction centered on the optical axis X.

(Modification 4)

Figure 12:
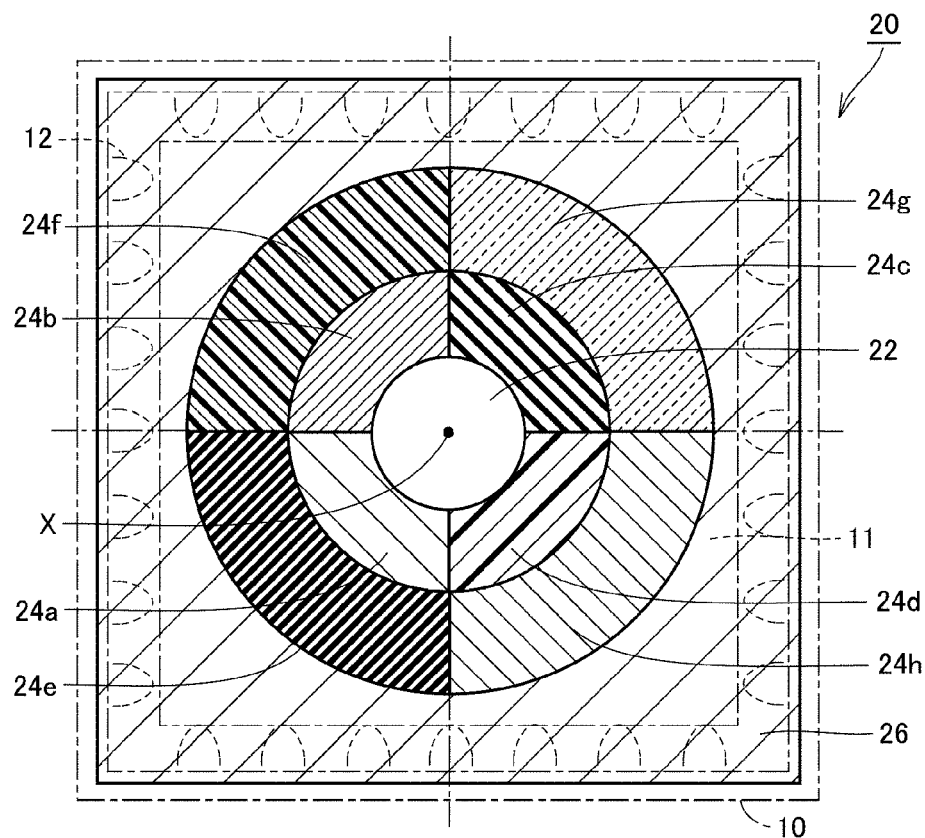
FIG. 12 schematically illustrates a configuration of a modification of the optical member shown in FIG. 1.

FIG. 12 schematically illustrates a configuration of a modification of the optical member 20 shown in FIG. 1. FIG. 12 is a view as seen from the direction A in FIG. 1.

Referring to FIG. 12, the optical member 20 according to the present modification has the first to eighth optical regions 24a to 24h and the light shielding region 26. In the optical member 20, the central region 22 centered on the optical axis X of the photographing part 30 is formed. In the example of FIG. 12, the central region 22 is a circular region, as in FIG. 2.

The first to eighth optical regions 24a to 24h are arranged so as to surround the central region 22. The first to eighth optical regions 24a to 24h have a quarter circular arc shape centered on the optical axis X, and are arranged along the circumferential direction centered on the optical axis X. The optical member 20 according to the present modification differs from the optical member 20 shown in FIG. 9 in that the fifth to eighth optical regions 24e to 24h are further arranged on an outer circumferential side of the first to fourth optical regions 24a to 24d.

Here, assuming that the light emitting surface 10A of the illumination part 10 is a two-dimensional polar coordinate plane centered on the optical axis X, the first to fourth optical regions 24a to 24d have the same range of radius direction (distance from the optical axis X) but mutually different ranges of deflection angle (angle from a half line passing through the optical axis X). The fifth optical region 24e has the same deflection angle range as but a different radius direction range from the first optical region 24a. The sixth optical region 24f has the same deflection angle range as but a different radius direction range from the second optical region 24b. The seventh optical region 24g has the same deflection angle range as but a different radius direction range from the third optical region 24c. The eighth optical region 24h has the same deflection angle range as but a different radius direction range from the fourth optical region 24d.

The first to eighth optical regions 24a to 24h change the illumination light (white light) emitted by the illumination part 10 into hue lights having mutually different color characteristics. Specifically, the first optical region 24a changes the illumination light into the first hue light (blue light). The second optical region 24b changes the illumination light into the second hue light (green light). The third optical region 24c changes the illumination light into the third hue light (red light). The fourth optical region 24d changes the illumination light into a fourth hue light (yellow light). The fifth optical region 24e changes the illumination light into a fifth hue light (magenta light). The sixth optical region 24f changes the illumination light into a sixth hue light (light magenta light). The seventh optical region 24g changes the illumination light into a sixth hue light (light cyan light). The eighth optical region 24h changes the illumination light into a fifth hue light (cyan light). Each of the first to eighth optical regions 24a to 24h can be formed using, for example, a color filter such as a color film or the like.

The light shielding region 26 is arranged so as to surround the first to eighth optical regions 24a to 24h and shields the illumination light.

With such a configuration, the workpiece 1 is irradiated with the illumination light (white light) emitted from the central region 22 and light composed of the first to eighth hue lights emitted respectively from the first to eighth optical regions 24a to 24h surrounding the central region 22.

In the present modification, the illumination light and the first to fourth hue lights are emitted toward the surface of the workpiece 1 from mutually different directions. The directions in which the first to fourth hue lights are emitted are the same as the directions in which the first to fourth hue lights are emitted in the optical member 20 shown in FIG. 9.

Similarly to the first to fourth hue lights, the fifth to eighth hue lights are emitted toward the surface of the workpiece 1 from mutually different directions.

The fifth hue light is emitted from the same direction as the first hue light. However, the fifth hue light and the first hue light are irradiated on the surface of the workpiece 1 at mutually different angles. The fifth hue light is irradiated at a larger angle with respect to the optical axis X than the first hue light.

The sixth hue light is emitted from the same direction as the second hue light. However, the sixth hue light and the second hue light are irradiated on the surface of the workpiece 1 at mutually different angles. The sixth hue light is irradiated at a larger angle with respect to the optical axis X than the second hue light.

The seventh hue light is emitted from the same direction as the third hue light. However, the seventh hue light and the third hue light are irradiated on the surface of the workpiece 1 at mutually different angles. The seventh hue light is irradiated at a larger angle with respect to the optical axis X than the third hue light.

The eighth hue light is emitted from the same direction as the fourth hue light. However, the eighth hue light and the fourth hue light are irradiated on the surface of the workpiece 1 at mutually different angles. The eighth hue light is irradiated at a larger angle with respect to the optical axis X than the fourth hue light.

By photographing the workpiece 1 under such illumination, a color image is generated in which, in the surface of the workpiece 1, a nearly flat element (i.e., an element nearly perpendicular to the optical axis X) becomes white, an element that is inclined so that the normal approaches an emission direction of the first and fifth hue lights has the first hue (blue) or the fifth hue (magenta), an element that is inclined so that the normal approaches an emission direction of the second and sixth hue lights has the second hue (green) or the sixth hue (light magenta), an element that is inclined so that the normal approaches an emission direction of the third and seventh hue lights has the third hue (red) or the seventh hue (light cyan), and an element that is inclined so that the normal line approaches an emission direction of the fourth and eighth hue lights has the fourth hue (yellow) or the eighth hue (cyan).

In the above color image, it is known that the surface element of the first hue and the surface element of the fifth hue are inclined in the same direction, but the surface element of the fifth hue is more sharply inclined. Similarly, it is known that the surface element of the second hue and the surface element of the sixth hue are inclined in the same direction, but the surface element of the sixth hue is more sharply inclined. In this way, by observing a hue pattern of a portion of the workpiece 1 in the photographed image, the state of inclination of the surface of the workpiece 1 can be detected.

In the case of using the optical member 20 shown in FIG. 12, the first to eighth hue lights are irradiated on the surface of the workpiece 1 in a manner that at least one of irradiation direction and irradiation angle differs therebetween. Hence, based on the color image, what inclination angle each surface element of the workpiece 1 has can be detected, and which direction each surface element is inclined in can also be detected. This is because, in the optical member 20 of FIG. 9, the first to eighth optical regions 24a to 24h are different from each other in at least one of radius direction range and deflection angle range on the polar coordinate plane.

In the optical member 20 of FIG. 12, by further increasing at least one of the number of optical regions aligned in the circumferential direction centered on the optical axis X and the number of optical regions aligned in the radial direction, it is possible to inspect the surface state of the workpiece 1 in more detail. However, in order to detect a plurality of hue lights corresponding to the optical regions in the photographing part 30, it is necessary that the light emitted from each of the optical regions be included in the photographing wavelength region of the photographing part 30.

(Modification 5)

Figure 13:
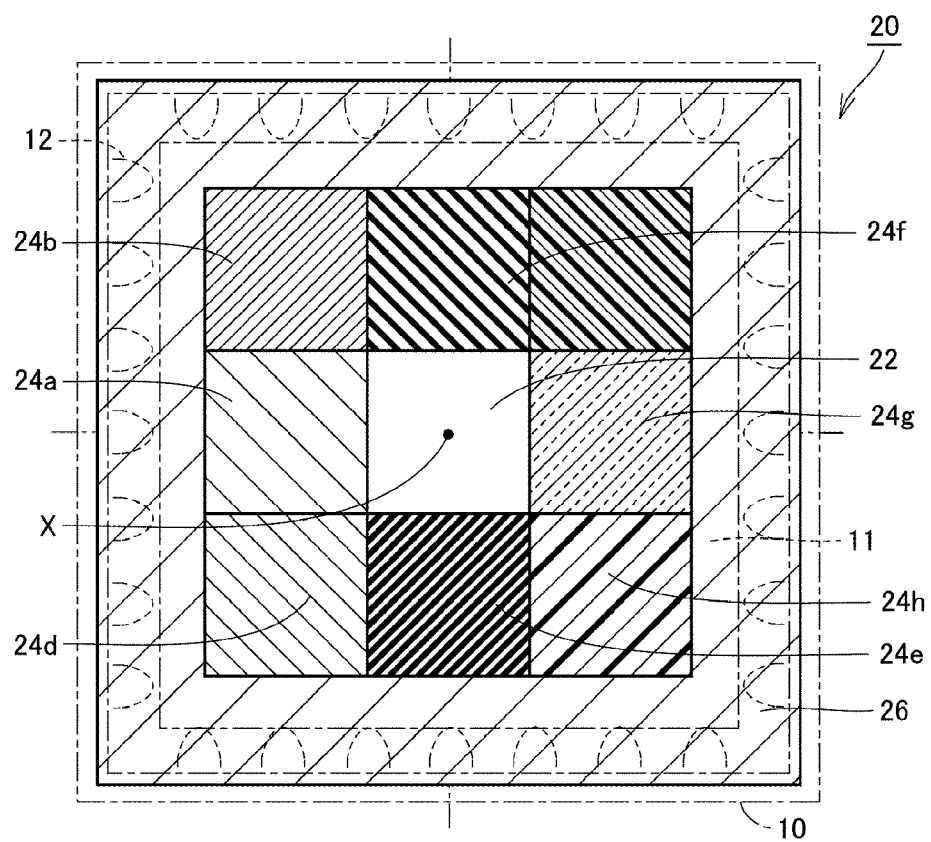
FIG. 13 schematically illustrates a configuration of a modification of the optical member shown in FIG. 1.

FIG. 13 schematically illustrates a configuration of a modification of the optical member 20 shown in FIG. 1. FIG. 13 is a view as seen from the direction A in FIG. 1.

Referring to FIG. 13, the optical member 20 according to the present modification has the first to eighth optical regions 24a to 24h and the light shielding region 26. In the optical member 20, the central region 22 centered on the optical axis X of the photographing part 30 is formed. In the example of FIG. 13, the central region 22 is a quadrangular region, as in FIG. 2.

The first to eighth optical regions 24a to 24h are arranged so as to surround the central region 22. The first to eighth optical regions 24a to 24h have a quadrangular shape and are arranged in a matrix. Therefore, assuming that the light emitting surface 10A of the illumination part 10 is a two-dimensional XY coordinate plane centered on the optical axis X, the first to eighth optical regions 24a to 24h are different from each other in at least one of the X coordinate range and the Y coordinate range. In this way, the optical member 20 according to the present modification differs from the optical member 20 shown in FIG. 12 in shape and arrangement of the first to eighth optical regions 24a to 24h.

The first to eighth optical regions 24a to 24h change the illumination light (white light) emitted by the illumination part 10 into hue lights having mutually different color characteristics. Each of the first to eighth optical regions 24a to 24h can be formed using, for example, a color filter such as a color film or the like.

The light shielding region 26 is arranged so as to surround the first to eighth optical regions 24a to 24h and shields the illumination light.

With such a configuration, the workpiece 1 is irradiated with the illumination light (white light) emitted from the central region 22 and light composed of the first to eighth hue lights emitted respectively from the first to eighth optical regions 24a to 24h surrounding the central region 22.

In the present modification, the illumination light and the first to eighth hue lights are irradiated on the surface of the workpiece 1 in a manner that at least one of irradiation direction and irradiation angle differs therebetween. Therefore, similarly to the optical member 20 of FIG. 12, based on the color image, what inclination angle each surface element of the workpiece 1 has can be detected, and which direction each surface element is inclined in can also be detected.

Moreover, in the optical member 20 of FIG. 13, by further increasing the number of the optical regions arranged in a matrix, it becomes possible to inspect the surface state of the workpiece 1 in more detail. However, in order to detect a plurality of hue lights corresponding to the optical regions in the photographing part 30, it is necessary that the light emitted from each of the optical regions be included in the photographing wavelength region of the photographing part 30.

(Modification 6)

Figure 14:
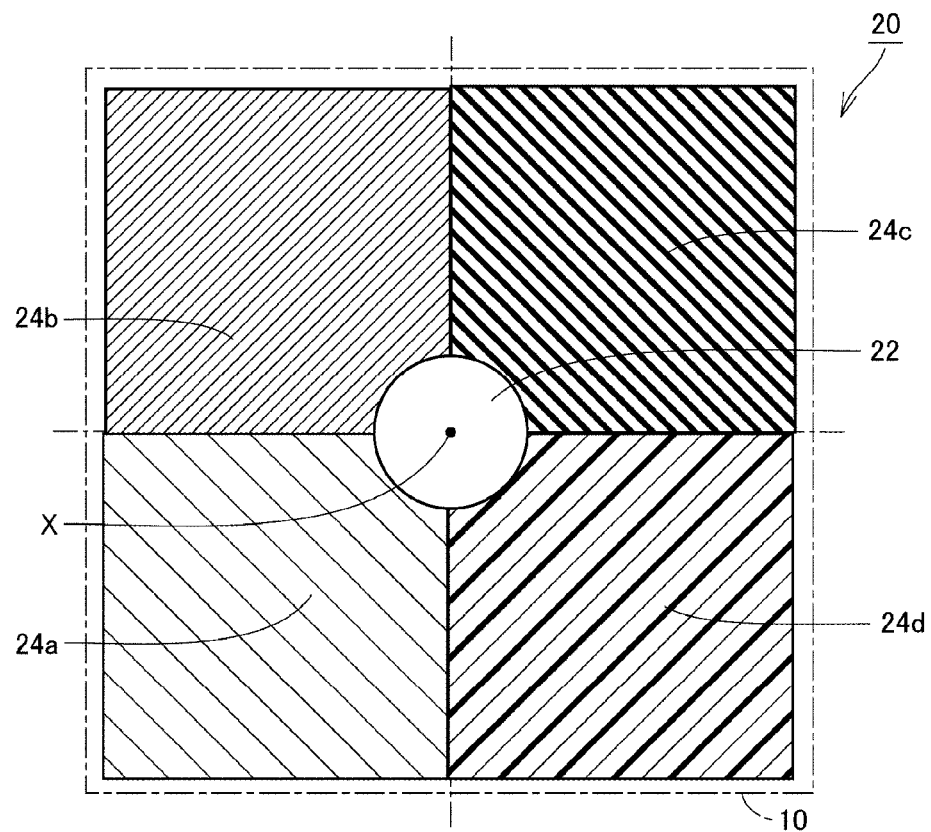
FIG. 14 schematically illustrates a configuration of a modification of the optical member shown in FIG. 1.

FIG. 14 schematically illustrates a configuration of a modification of the optical member 20 shown in FIG. 1. FIG. 14 is a view as seen from the direction A in FIG. 1.

Referring to FIG. 14, the optical member 20 according to the present modification has the first to fourth optical regions 24a to 24d. A basic configuration of the optical member 20 according to the present modification is the same as that of the optical member 20 shown in FIG. 11. The difference lies in that the first to fourth optical regions 24a to 24d are increased in size and do not have the light shielding region 26.

In the present modification, since the shape of the first to fourth optical regions 24a to 24d as a whole is quadrangular, same as the shape of the light emitting surface 10A of the illumination part 10, the first to fourth optical regions 24a to 24d as a whole and the light emitting surface 10A are made to have the same size. According to this, since all the light emitted from the light emitting surface 10A can be used for inspection of the surface state of the workpiece 1, the light shielding region 26 is unnecessary.

(Modification 7)

Figure 15:
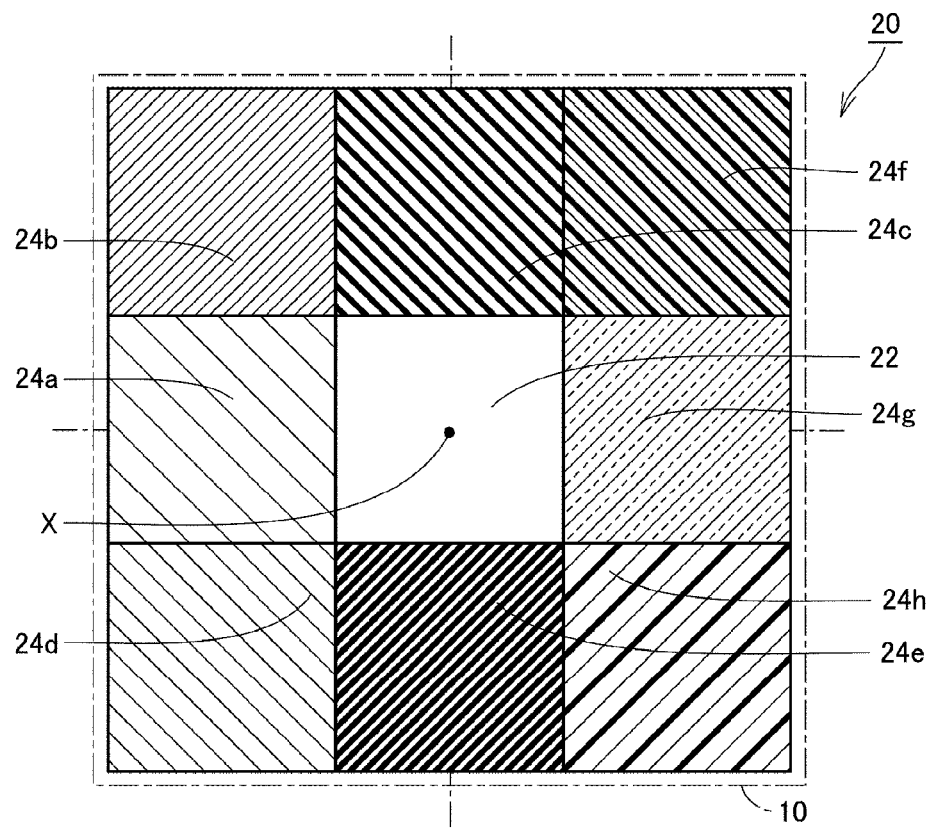
FIG. 15 schematically illustrates a configuration of a modification of the optical member shown in FIG. 1.

FIG. 15 schematically illustrates a configuration of a modification of the optical member 20 shown in FIG. 1. FIG. 15 is a view as seen from the direction A in FIG. 1.

Referring to FIG. 15, the optical member 20 according to the present modification has the first to eighth optical regions 24a to 24h. A basic configuration of the optical member 20 according to the present modification is the same as that of the optical member 20 shown in FIG. 13. The difference lies in that the first to eighth optical regions 24a to 24h are increased in size and do not have the light shielding region 26.

In the present modification, since the shape of the first to eighth optical regions 24a to 24h as a whole is quadrangular, same as the shape of the light emitting surface 10A of the illumination part 10, the first to eighth optical regions 24a to 24h as a whole and the light emitting surface 10A are made to have the same size. According to this, since all the light emitted from the light emitting surface 10A can be used for inspection of the surface state of the workpiece 1, the light shielding region 26 is unnecessary.

[Additional Remark]

As stated above, the present embodiment and the modifications include the following disclosures.

(Configuration 1)

An image inspection device (100) detecting a surface state of an object (1), the image inspection device (100) including:

a photographing part (30) photographing the object;

a light transmissive illumination part (10) arranged between the object and the photographing part and having a light emitting surface (10A) arranged to face the object; and an optical member (20) arranged on the light emitting surface of the illumination part and transmitting light emitted by the illumination part toward the object, wherein the optical member includes a plurality of optical regions (24a to 24h) arranged so as to surround a central region (22) of the light emitting surface centered on an optical axis (X) of the photographing part and configured to emit light having mutually different color characteristics toward the object.

(Configuration 2)

The image inspection device according to Configuration 1, wherein the optical regions are concentrically arranged around the optical axis on the light emitting surface.

(Configuration 3)

The image inspection device according to Configuration 1, wherein the optical regions are arranged on the light emitting surface along a circumferential direction centered on the optical axis.

(Configuration 4)

The image inspection device according to Configuration 1, wherein the optical regions are arranged in a matrix on the light emitting surface.

(Configuration 5)

The image inspection device according to any of Configuration 1 to Configuration 4, wherein the illumination part emits white light; and the optical member includes a plurality of color filters arranged respectively in the optical regions and transmitting light of mutually different wavelengths.

(Configuration 6)

The image inspection device according to any of Configuration 1 to Configuration 4, wherein the illumination part emits excitation light; and the optical member includes a plurality of phosphors arranged respectively in the optical regions and converting the excitation light into light of mutually different wavelengths.

(Configuration 7)

The image inspection device according to any of Configuration 1 to Configuration 6, wherein the optical member further includes a light shielding region (26) arranged so as to surround the optical regions and shielding the light emitted by the illumination part.

(Configuration 8)

The image inspection device according to any of Configuration 1 to Configuration 7, wherein the object is located within the central region in plan view of the optical member as seen from the side of the photographing part.

(Configuration 9)

The image inspection device according to any of Configuration 1 to Configuration 8, wherein the optical regions emit the light having mutually different color characteristics within a photographing wavelength region of the photographing part toward the object.

(Configuration 10)

The image inspection device according to any of Configuration 1 to Configuration 9, further including a light shielding member (15) arranged on a surface of the illumination part opposite the light emitting surface and shielding light incident from outside the illumination part, wherein the light shielding member has an opening part (15a) formed so that at least a portion of the opening part overlaps the central region in plan view as seen from the optical axis of the photographing part.

(Configuration 11)

The image inspection device according to Configuration 10, wherein the light shielding member is configured to reflect the illumination light toward the light emitting surface.

(Configuration 12)

An illumination device including the illumination part and the optical member according to any of Configuration 1 to Configuration 11.

The embodiments disclosed herein are examples in all aspects and should not be interpreted as limitations. The scope of the invention is defined by claims instead of the above descriptions, and it is intended to include all modifications within the scope of the claims and the equivalents thereof.

What is claimed is:

1. An image inspection device detecting a surface state of an object, the image inspection device comprising:
    a photographing part photographing the object;
    a light transmissive illumination part arranged between the object and the photographing part and having a light emitting surface arranged to face the object; and
    an optical member arranged on the light emitting surface of the illumination part and transmitting light emitted by the illumination part toward the object, wherein
    the optical member comprises a plurality of optical regions arranged so as to surround a central region of the light emitting surface centered on an optical axis of the photographing part and configured to emit light having mutually different color characteristics toward the object,
    the object is located within the central region in plain view of the optical member as seen from the side of the photographing part, a part of an illumination light emitted by the illumination part is transmitted through the central region and is irradiated on the object,
    the object is irradiated with the part of the illumination light emitted from the central region, and the object is irradiated with other parts of the illumination light emitted from the plurality of optical region, wherein the part of the illumination light emitted from the central region has color characteristic different from the color characteristics of the other parts of the illumination light emitted from the plurality of optical region.

2. The image inspection device according to claim 1, wherein the optical regions are concentrically arranged around the optical axis on the light emitting surface.

3. The image inspection device according to claim 1, wherein the optical regions are arranged on the light emitting surface along a circumferential direction centered on the optical axis.

4. The image inspection device according to claim 1, wherein the optical regions are arranged in a matrix on the light emitting surface.

5. The image inspection device according to claim 4, wherein
    the illumination part emits white light, and
    the optical member comprises a plurality of color filters arranged respectively in the optical regions and transmitting light of mutually different wavelengths.

6. The image inspection device according to claim 3, wherein
    the illumination part emits white light, and
    the optical member comprises a plurality of color filters arranged respectively in the optical regions and transmitting light of mutually different wavelengths.

7. The image inspection device according to claim 2, wherein
    the illumination part emits white light, and
    the optical member comprises a plurality of color filters arranged respectively in the optical regions and transmitting light of mutually different wavelengths.

8. The image inspection device according to claim 1, wherein
    the illumination part emits white light, and
    the optical member comprises a plurality of color filters arranged respectively in the optical regions and transmitting light of mutually different wavelengths.

9. The image inspection device according to claim 4, wherein
    the illumination part emits excitation light; and
    the optical member comprises a plurality of phosphors arranged respectively in the optical regions and converting the excitation light into light of mutually different wavelengths.

10. The image inspection device according to claim 3, wherein
    the illumination part emits excitation light; and
    the optical member comprises a plurality of phosphors arranged respectively in the optical regions and converting the excitation light into light of mutually different wavelengths.

11. The image inspection device according to claim 2, wherein
    the illumination part emits excitation light; and
    the optical member comprises a plurality of phosphors arranged respectively in the optical regions and converting the excitation light into light of mutually different wavelengths.

12. The image inspection device according to claim 1, wherein
    the illumination part emits excitation light; and
    the optical member comprises a plurality of phosphors arranged respectively in the optical regions and converting the excitation light into light of mutually different wavelengths.

13. The image inspection device according to claim 1, wherein the optical member further comprises a light shielding region arranged so as to surround the optical regions and shielding the light emitted by the illumination part.

14. The image inspection device according to claim 1, wherein the optical regions emit the light having mutually different color characteristics within a photographing wavelength region of the photographing part toward the object.

15. The image inspection device according to claim 1, further comprising a light shielding member arranged on a surface of the illumination part opposite the light emitting surface and shielding light incident from outside the illumination part, wherein
the light shielding member has an opening part formed so that at least a portion of the opening part overlaps the central region in plain view as seen from the optical axis of the photographing part.

16. The image inspection device according to claim 15, wherein the light shielding member is configured to reflect the light emitted by the illumination part toward the light emitting surface.

17. An illumination device comprising the illumination part and the optical member according claim 1.

* * * * *